(12) United States Patent
Mulkens et al.

(10) Patent No.: US 7,061,583 B2
(45) Date of Patent: Jun. 13, 2006

(54) LITHOGRAPHY APPARATUS

(75) Inventors: Johannesq Catharinus Hubertus Mulkens, Geldrop (NL); Gavin Charles Rider, Eindhoven (NL); Jan Wietse Ricolt Ten Cate, Staphorst (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/641,307

(22) Filed: Aug. 15, 2003

(65) Prior Publication Data

US 2004/0051858 A1    Mar. 18, 2004

Related U.S. Application Data

(60) Division of application No. 10/177,134, filed on Jun. 24, 2002, now abandoned, which is a continuation of application No. 09/287,014, filed on Apr. 6, 1999, now Pat. No. 6,452,662.

(30) Foreign Application Priority Data

Apr. 8, 1998    (EP)    .................... 98201110

(51) Int. Cl.
G03B 27/54    (2006.01)
G03B 27/42    (2006.01)

(52) U.S. Cl. ........................... 355/67; 355/53

(58) Field of Classification Search ................ 355/52, 355/53, 55, 67–71; 359/566, 569
See application file for complete search history.

(56) References Cited

U.S. PATENT DOCUMENTS

| | | | |
|---|---|---|---|
| 3,492,635 A | 1/1970 | Farr | |
| 3,639,039 A | 2/1972 | Rhodes, Jr. | |
| 3,658,420 A | 4/1972 | Axelrod | |
| 3,729,252 A | 4/1973 | Nelson | |
| 3,770,340 A | 11/1973 | Cronin et al. | |
| 3,776,633 A | 12/1973 | Frosch et al. | |
| 4,241,390 A | 12/1980 | Markle et al. | |
| 4,291,938 A | 9/1981 | Wagner | |
| 4,370,026 A | 1/1983 | Dubroeucq et al. | |
| 4,472,023 A | 9/1984 | Yamamoto | |
| 4,497,015 A | 1/1985 | Konno et al. | |
| 4,619,508 A | 10/1986 | Shibuya et al. | |
| 4,780,747 A | 10/1988 | Suzuki et al. | |
| 4,789,222 A | 12/1988 | Ota et al. | |
| 4,814,829 A | 3/1989 | Kosugi et al. | |
| 4,841,341 A | 6/1989 | Ogawa et al. | |
| 4,851,882 A | 7/1989 | Takahashi et al. | |
| 4,854,669 A | 8/1989 | Birnbach et al. | |

(Continued)

FOREIGN PATENT DOCUMENTS

EP    0 011 709 A2    10/1979

(Continued)

OTHER PUBLICATIONS

Cronin et al., "Dynamic Coherent Optical System," Optical Engineering, Mar./Apr. 1973, vol. 12, No. 2, pp. 50-55.

(Continued)

*Primary Examiner*—Henry Hung Nguyen
(74) *Attorney, Agent, or Firm*—Pillsbury Winthrop Shaw Pittman, LLP

(57) ABSTRACT

An illumination system for a microlithographic exposure apparatus comprises an adjustable axicon, a variable zoom element, and a multipole illumination mode generating element. By controlling the optical components, the illumination mode can be varied continuously between conventional, annular, and multipole.

27 Claims, 9 Drawing Sheets

U.S. PATENT DOCUMENTS

| | | | |
|---|---|---|---|
| 4,931,830 A | 6/1990 | Suwa et al. | |
| 4,936,665 A | 6/1990 | Whitney | |
| 4,939,630 A | 7/1990 | Kikuchi | |
| 4,947,413 A | 8/1990 | Jewell et al. | |
| 4,970,546 A | 11/1990 | Suzuki et al. | |
| 4,988,188 A | 1/1991 | Ohta | |
| 5,004,348 A | 4/1991 | Magome | |
| 5,153,773 A | 10/1992 | Muraki et al. | |
| 5,191,374 A | 3/1993 | Hazama et al. | |
| 5,305,054 A | 4/1994 | Suzuki et al. | |
| 5,337,097 A | 8/1994 | Suzuki et al. | |
| 5,517,279 A | 5/1996 | Hugle et al. | |
| 5,572,287 A * | 11/1996 | Wangler et al. | 355/53 |
| 5,598,250 A | 1/1997 | Bae | |
| 5,638,211 A | 6/1997 | Shiraishi | |
| 5,659,409 A | 8/1997 | Ooi et al. | |
| 5,673,102 A | 9/1997 | Suzuki et al. | |
| 5,675,401 A | 10/1997 | Wangler et al. | |
| 5,712,698 A | 1/1998 | Poschenrieder et al. | |
| 5,742,376 A | 4/1998 | Makinouchi | |
| 5,757,470 A * | 5/1998 | Dewa et al. | 355/67 |
| 5,896,188 A * | 4/1999 | McCullough | 355/67 |
| 5,963,305 A * | 10/1999 | Mizouchi | 355/67 |
| 6,016,187 A | 1/2000 | Noguchi et al. | |
| 6,049,374 A | 4/2000 | Komatsuda | |
| 6,084,655 A | 7/2000 | Suzuki et al. | |
| 6,128,068 A | 10/2000 | Suzuki et al. | |
| 6,211,944 B1 | 4/2001 | Shiraishi | |
| 6,233,041 B1 | 5/2001 | Shiraishi | |
| 6,252,647 B1 | 6/2001 | Shiraishi | |
| 6,259,512 B1 | 7/2001 | Mizouchi | |
| 6,271,909 B1 | 8/2001 | Suzuki et al. | |
| 6,285,443 B1 * | 9/2001 | Wangler et al. | 355/67 |
| 6,285,855 B1 | 9/2001 | Tsuji | |
| 6,628,370 B1 * | 9/2003 | McCullough et al. | 355/53 |
| 2001/0007495 A1 | 7/2001 | Suzuki et al. | |
| 2001/0015797 A1 | 8/2001 | Suzuki et al. | |

FOREIGN PATENT DOCUMENTS

| | | |
|---|---|---|
| EP | 747772 A1 | 4/1996 |
| JP | 61-91662 A | 5/1986 |
| WO | WO 92/03842 | 3/1992 |

OTHER PUBLICATIONS

Reynolds, "A Concept for a High Resolution Optical Lithographic System for Producing One-Half MicronLinewidths," Optical Microlithography V (1986) SPIE vol. 633, pp. 228-238.

Yang et al., "Effect of Central Obscurationon Image Formation in Projection Lithography," SPIEvol. 1264 Optical/Laser Microlithography III (1990), pp. 477-485.

Pol et al., "Excimer laser based lthography: a deep-ultraviolet wafer stepper for VLSI processing," Optical Engineering, Apr. 1987, vol. 26, No. 4, pp. 311-318.

Berry, "Pattern recognition automatic fine alignment," reprinted from Optical Microlithography—Technologyfor the Mid-1980s, Proc. SPIE vol. 334, pp. 10-16 (1982).

Fehrs et al. "Illuminator Modification of an Optical Aligner," KTI Microelectronics Seminar, Proceddings, Nov. 6-7, 1989, San Diego, CA pp. 217-230.

* cited by examiner

LITHOGRAPHY APPARATUS

CROSS-REFERENCE TO RELATED APPLICATIONS

This application is a divisional of U.S. application Ser. No. 10/177,134, filed Jun. 24, 2002, which is a continuation of U.S. patent application Ser. No. 09/287,014, filed Apr. 6, 1999, now U.S. Pat. No. 6,452,662, which claims priority to European Patent Application No. 98-201110.8, filed Apr. 8, 1998, the entire contents of all of which are incorporated herein by reference.

BACKGROUND

The present invention relates to an illumination system, for a microlithographic exposure apparatus having a diffractive optical element to reshape a radiation beam, and to said diffractive optical element. More particularly, the invention relates to the application of such a device in a lithographic projection apparatus.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include elements operating according to any of these principles for directing, shaping or controlling the projection beam of radiation and such elements may also be referred to below, collectively or singularly, as a "lens". Any refractive, reflective or catadioptric elements in the radiation or illumination systems may be based on a substrate of glass or other suitable material, and may be provided with either single- or multi-layer coatings as desired. In addition, the first and second object tables may be referred to as the "mask table" and the "substrate table", respectively. Further, the lithographic apparatus may be of a type having two or more mask tables and/or two or more substrate tables. In such "multiple stage" devices the additional tables may be used in parallel, or preparatory steps may be carried out on one or more stages while one or more other stages are being used for exposures. Twin stage lithographic apparatus are described in International Patent Applications WO98/28665 and WO98/40791.

Lithographic projection apparatus can be used, for example, in the manufacture of integrated circuits (ICs). In such a case, the mask (reticle) may contain a circuit pattern corresponding to an individual layer of the IC, and this pattern can then be imaged onto a target area (die) on a substrate (silicon wafer) which has been coated with a layer of photosensitive material (resist). In general, a single wafer will contain a whole network of adjacent dies which are successively irradiated through the reticle, one at a time. In one type of lithographic projection apparatus, each die is irradiated by exposing the entire reticle pattern onto the die in one go; such an apparatus is commonly referred to as a waferstepper. In an alternative apparatus—which is commonly referred to as a step-and-scan apparatus—each die is irradiated by progressively scanning the reticle pattern under the projection beam in a given reference direction (the "scanning" direction) while synchronously scanning the wafer table parallel or anti-parallel to this direction; since, in general, the projection system will have a magnification factor M (generally $\leq 1$), the speed v at which the wafer table is scanned will be a factor M times that at which the reticle table is scanned. More information with regard to lithographic devices as here described can be gleaned from International Patent Application WO 97/33205.

In one form of microlithography, a mask defining features is illuminated with radiation from an effective source having an intensity distribution at a pupil plane corresponding to a particular illumination mode. An image of the illuminated mask is projected onto a resist-coated semiconductor wafer.

One method to reduce feature size, i.e. increase resolution, in optical lithography, is off-axis illumination. With this technique, the mask is illuminated at non-perpendicular angles which may improve resolution, but particularly improves the process latitude by increasing the depth of focus and/or contrast One known illumination mode is annular, in which the conventional zero order spot on the optical axis is changed to a ring-shaped intensity distribution. Another mode is multipole illumination in which several spots or beams are produced which are not on the optical axis. The spatial intensity distribution at the pupil plane is converted into an angular distribution at the mask plane.

Problems with the prior art include lack of flexibility of the illumination system such as only having fixed illumination modes or a limited range of modes or difficulty in selecting or mixing desired modes. Some prior systems also have a high loss of energy by blocking parts of the illuminating radiation.

SUMMARY

It is an object of the present invention to alleviate, at least partially, at least some of the above problems.

According to the present invention, this and other objects are achieved in a lithographic projection apparatus as described in the opening paragraph, wherein the radiation system comprises an illumination system which comprises:

an adjustable axicon; and a variable zoom element;

characterized by further comprising an adjustable element for generating a multipole illumination mode, whereby at least one spatial parameter of said multipole illumination mode can be continuously varied.

The illumination system according to the invention enables a range of illumination modes to be produced including conventional, annular and quadrupole. The axicon, zoom and multipole generating element allow the spatial intensity distribution of the illumination mode to be continuously varied. The spatial intensity distribution results in angular or oblique illumination of the reticle which improves the process latitude of the lithographic exposure apparatus.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the term "reticle", "wafer" or "die" in this text should be considered as being replaced by the more general terms "mask", "substrate" and "target area", respectively.

BRIEF DESCRIPTION OF THE DRAWINGS

Embodiments of the invention will now be described, by way of example only, with reference to the accompanying drawings in which:

FIG. 5b shows an illumination intensity distribution obtained with the embodiment of FIG. 5a;

FIGS. 6 and 7 show further alternative embodiments to that of FIG. 5a;

DETAILED DESCRIPTION

Figure 1:
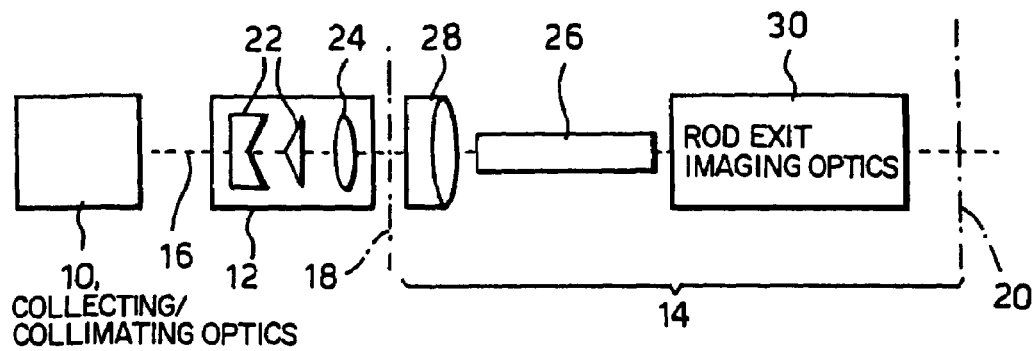
FIGS. 1 and 2 illustrate prior illumination systems.
Figure 2:
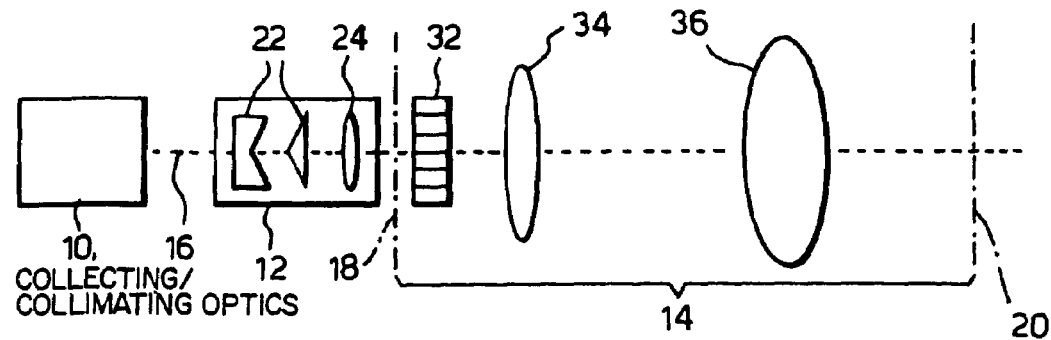

Two prior illumination systems are illustrated schematically in FIGS. 1 and 2. The systems illustrated in FIGS. 1 and 2 have: light collecting/collimating optics 10; an axicon/zoom module 12; and light integrating and projecting optics 14. the systems define an optical axis 16, a pupil plane 18, and reticle plane 20. The axicon/zoom module 12 comprises a pair of axicons 22, one concave and one convex, whose separation can be varied. The module 12 also comprises a zoom lens 24.

Figure 3:
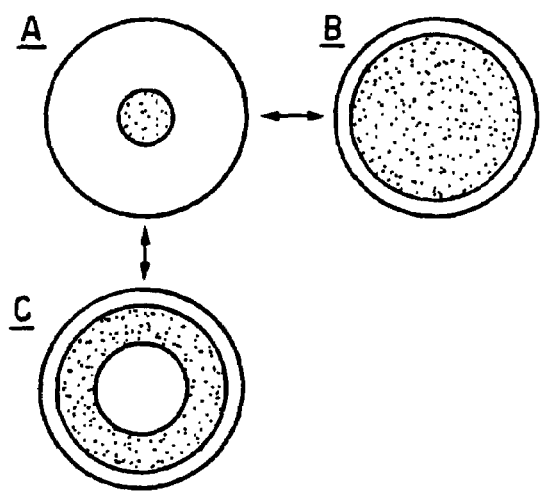
FIG. 3 illustrates some illumination intensity distributions obtainable with prior systems.

For the case of conical axicons, some examples of the illumination intensity distributions achievable at the pupil plane 18 are shown in FIG. 3. The spot size can be varied between states A and B by changing the zoom lens position. Similarly, the annularity can be changed between states A and C by varying the axicon opening (separation between the axicons).

To improve the illumination homogeneity, an optical integrator is used. In FIG. 1 this takes the form of a light pipe 26, such as a glass, calcium fluoride or quartz rod. A coupler 28 couples the illumination at the pupil plane 18 into the rod 26, and rod exit imaging optics 30 are also provided. In FIG. 2 a fly's eye element 32 acts as the integrator. The fly's eye element 32 is a composite lens comprising an array or honeycomb of small lenses. Further objective lenses 34, 36 complete the projection optics.

Further details of such illumination systems are disclosed in EP-A-687 956. The present invention can be embodied in illumination systems as described above, and in the following description like items are given like reference numerals.

The embodiments of the invention described below relate to quadrupole illumination modes as a particular example of multipole illumination. Other modes are of course possible with the invention, such as dipole.

Figure 4:
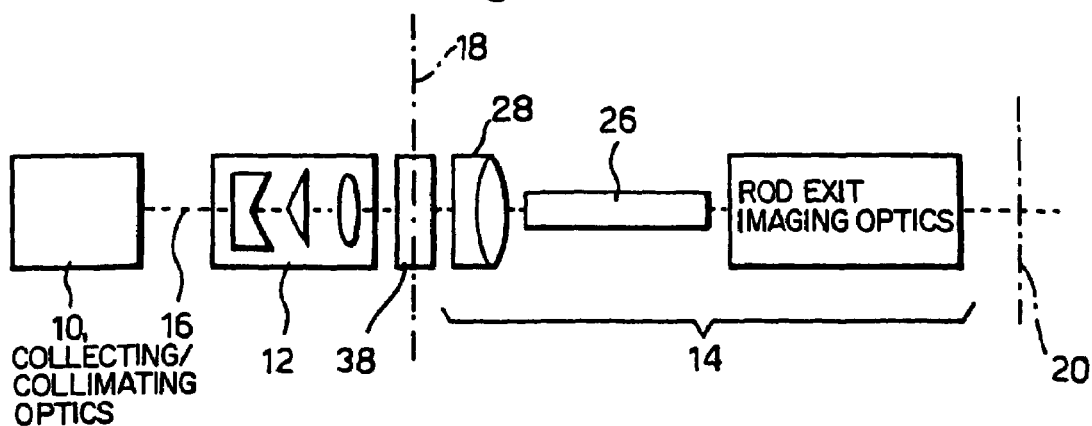
FIG. 4 shows an illumination system for use in the invention.

A first embodiment of the invention is shown in FIG. 4. The illumination system has: light collecting/collimating optics 10; an axicon/zoom module 12; multipole mode generating element 38; and light integrating and projecting optics 14. The components lie along optical axis 16 and are used to illuminate a reticle (not shown) located at reticle plane 20 which then produces an exposure pattern in etch resist on a wafer (not shown), via a projection system (also not shown). The system illustrated in FIG. 4 includes a quartz rod light integrator 26, although the invention can be embodied in other systems such as that illustrated in FIG. 2. FIG. 4 shows the multipole mode generating element 38 located between the axicon/zoom module 12 and the integrating/projecting optics 14 at the pupil plane 18 of the system. Several embodiments will be described later in which the element is located elsewhere in the system, for example before the axicon/zoom module 12, interposable within the axicon/zoom module 12, and at the entrance window of the rod 26. The location is related to the particular multipole mode generating element 38 that is being used, as described in the following embodiments. The optical axis 16 shown in FIG. 4 can of course be folded to produce a more compact illumination system.

Figure 5A:
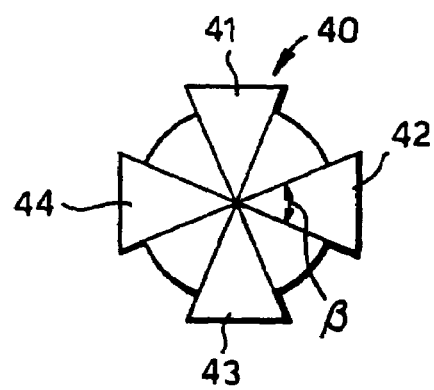
FIG. 5a shows an embodiment of a multipole mode generating element of the system of FIG. 4.
Figure 5B:
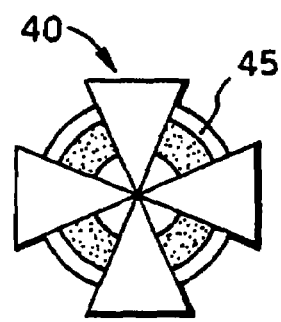
Figure 6:
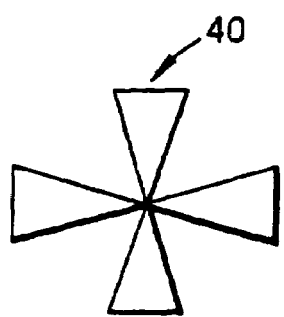

An embodiment of the multipole mode generating element 38 is shown in FIG. 5a. The element 38 has four triangular blades 41, 42, 43, 44 insertable into the beam path at the pupil plane and which form a Maltese cross 40, which is also referred to herein as a Maltese aperture blade (MAB). Each blade has an apex angle β. FIG. 5b shows the illumination intensity distribution resulting from the combination of an annular illumination mode produced by the axicon/zoom module and the MAB. The distribution has four light beams or poles 45. This embodiment enables continuously variable quadrupole illumination modes to be produced. The radial position of each pole can be varied by adjusting the axicon optics, the radial width of each pole can be varied by adjusting the zoom lens, and the tangential pole width can be changed by inserting another set of blades having a different apex angle β, such as Maltese cross 40 shown in FIG. 6. By removing the blades altogether, the illumination system can be used for conventional and/or annular modes, again with continuous variation.

Figure 7:
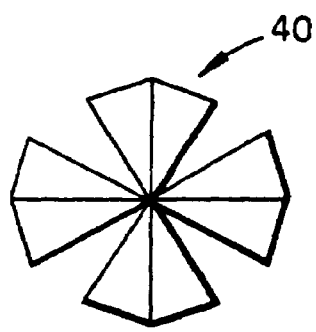

Interposing blades of different angle β permits the tangential pole width to be changed in discrete steps. According to a further embodiment f the invention, the tangential pole width can be continuously varied by each arm of the Maltese cross comprising a stack of n blades, rotatable with respect to each other about the optical axis of the system where their vertices lie. If the angle of each separate blade is β, the overall segment angle can be continuously varied from β to nβ, thus the tangential width of each pole can be varied between the angles π/2-β and π/2-nβ. The rotation of the blades to vary the effective width of each arm of the Maltese cross can be automated. A simple embodiment is shown in FIG. 7 in which each stack consists of two blades. FIG. 7 shows the blades of each stack spread out. When the blades are aligned, the Maltese cross 40 will look the same as that shown in FIG. 6. Another variation is to have blades rotatable about radial axes to permit their effective width to be varied, for example two blades hinged in the form of a butterfly.

According to a further embodiment, just two blades are used as the multipole mode generating element 38 in an optical system which includes a light pipe, such as a rectangular quartz rod 26, as shown in the illumination system of FIG. 4. One of the blades is oriented parallel to the short side of the rectangular cross-section of the light pipe and the other blade parallel to the long side. Due to the multiple reflections in the pipe, the resulting illumination mode is a mixture of annular and quadrupole. The two-blade system can produce an illumination mode including a quadruple component with lower energy-loss than the Maltese cross arrangement, as there are fewer blades obstructing the light beam. In one example the blades are triangular and are like two perpendicular aims of a Maltese cross, e.g. blades 41 and 42 shown in FIG. 5a. One or both of the blades in this embodiment can be a composite blade comprising a stack of smaller rotatable blades as described above.

Typically the blades are positioned along directions corresponding to orthogonal lines on the reticle, so that the light poles are located in each quadrant with centres forty five degrees from the orthogonal lines. This orientation can produce optimal projection of the lines, particularly for dense structures, such as for DRAM-like structures. The orthogonal lines are generally referred to as horizontal and vertical.

A further variation on the above embodiments using blades is to make all the blades rotatable about the optical axis of the illumination system so that the position of the poles can be rotated.

Figure 8:
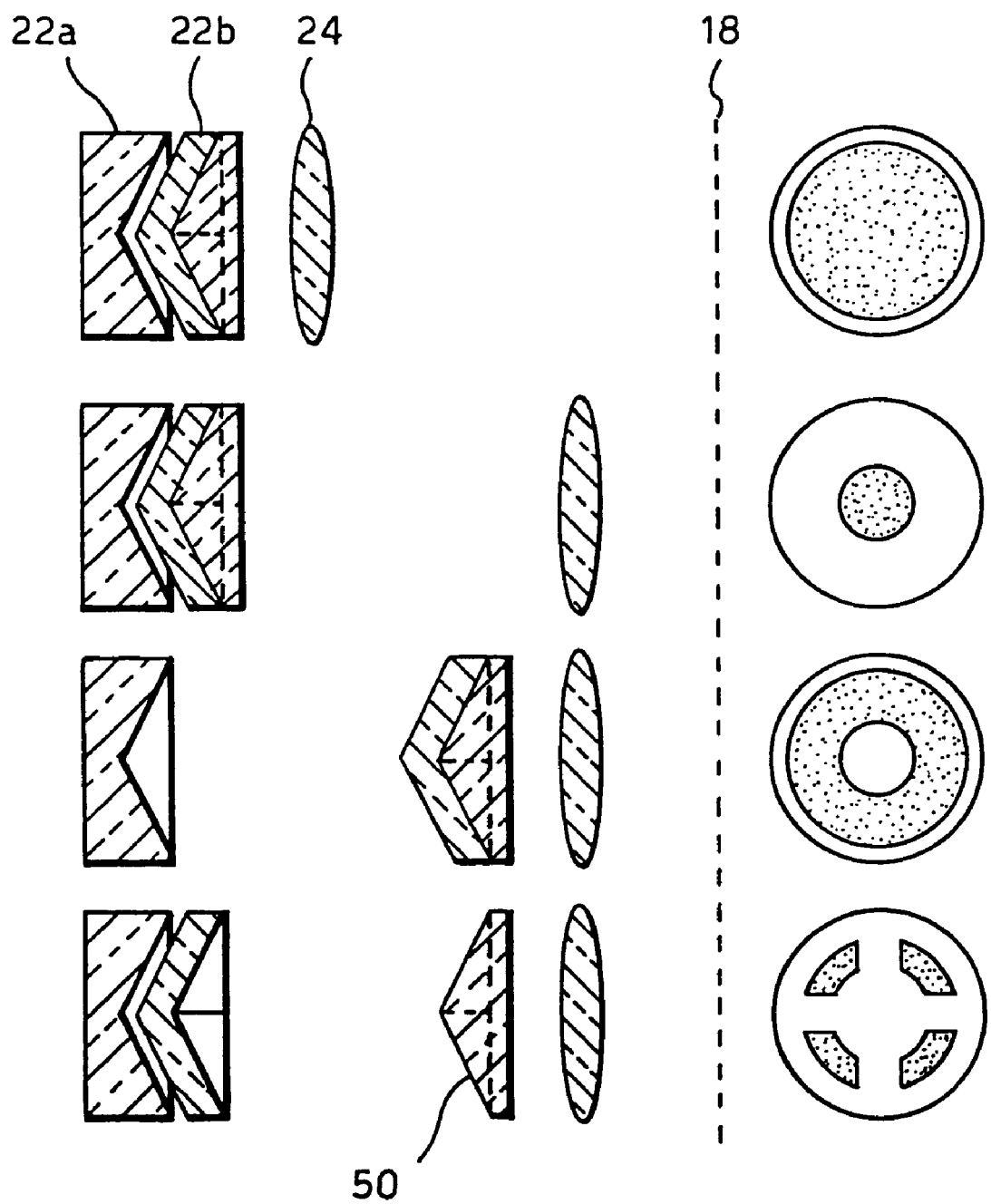
FIG. 8 shows in cross-section another embodiment of an illumination system for use in the invention and the resulting illumination intensity distribution.

The next embodiment of the invention has an axicon/zoom module with a pyramidal prism as the multipole mode generating element. This also enables conventional, annular and quadrupole illumination to be produced with continuous variations of the modes. FIG. 8 shows the optical components of an axicon/zoom module. The right hand column in FIG. 8 shows the illumination intensity distributions at the pupil plane 18 for various positions of the axicon pair 22a, 22b and zoom lens 24. The axicon pair 22 comprises a pair of elements having conical surfaces, one concave 22a, one convex 22b, to produce circular and annular illumination patterns. The fourth row shows the effect of separating a pyramid-shaped prism 50 from element 22b. The side of the element 22b facing the pyramid 50 is concave pyramidal for receiving the pyramid 50. Element 22b and pyramid 50 comprise a second axicon also known as a pyramidal axicon or pyramidon. The pyramid-shaped prism 50 has a four-sided base, which consequently produces quadrupole mode illumination patterns, such as the four spots illustrated at the bottom in the right hand column in FIG. 8.

The illumination system of FIG. 8 is extremely versatile in that the illumination mode can be varied continuously from conventional to annular or quadrupole. The zoom lens 24 sets the spot size or partial coherence factor, the axicon 22 determines the annularity, and a pyramidon 50 determines the quadrupolarity. In addition, since light flux is redistributed rather than blocked, there is virtually no light loss, so that a high throughout can be maintained.

Figure 9:
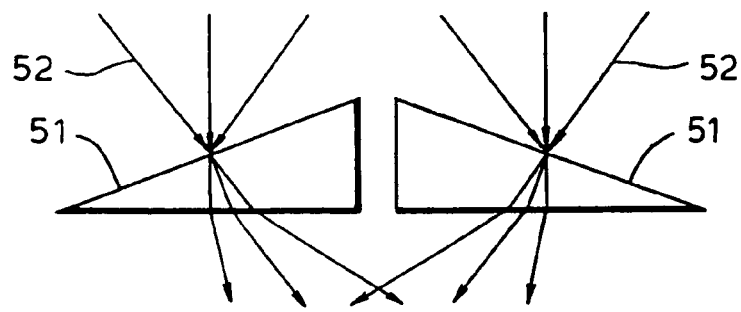
FIG. 9 illustrates the effect of a wedge-shaped optical element on a light cone.

With reference to the system of FIG. 1, as discussed earlier, spatial intensity distribution at the pupil plane 18 corresponds to an angular distribution at the entrance and exit planes of the quartz rod 26. Angular or off-axis illumination at the reticle can improve process latitude. FIG. 9 shows one way of altering the angular distribution of the illumination using wedge-shaped optical elements. A pair of incident light cones 52 with axes parallel to the optical axis emerge from the wedges 51 as light cones inclined at an angle to the optical axis.

Figure 10:
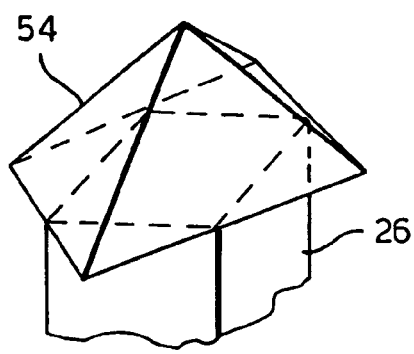
FIG. 10 shows a pyramidal block on the entrance window plane of a quartz rod according to another embodiment of the invention.
Figure 11:
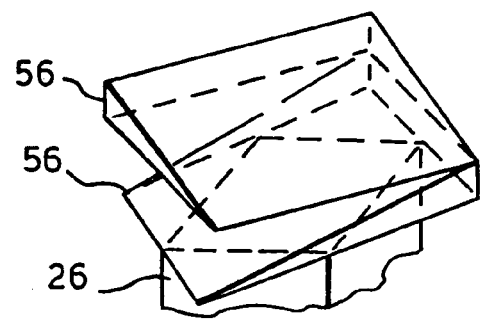
FIG. 11 illustrates a double wedge element located at the entrance window of a quartz rod according to another embodiment of the invention.

FIG. 10 shows an embodiment of the invention employing this principle. A pyramidal element 54 is positioned on the entrance plane of the rod 26. The inclined faces of the pyramid act as wedge-shaped refractive elements. Light incident on the pyramid is refracted in four directions, so quadrupole-like illumination is created. FIG. 11 shows an embodiment comprising a pair of wedge-shaped elements 56 placed in series in front of the entrance window of the rod 26. The wedges 56 are rotated by 90° with respect to each other to tilt an incident light cone in two directions, which after multiple reflections in the rod 26 creates quadrupole-like illumination. Thus tilting the light cone in only two orthogonal directions can still produce quadrupole illumination. Once again, since light flux is redistributed rather than blocked, there is virtually no light loss, so that a high throughout can be maintained.

A variation on the above pyramid and wedge embodiments is to replace the single large pyramid or wedges by an array of many small pyramids or wedges. The light deviation with small elements can be obtained by diffractive as well as refractive effects. In the case of an array of wedges, one can alternate the orientation of the wedge faces within the array rather than stacking pairs of wedges on top of each other.

Figure 12:
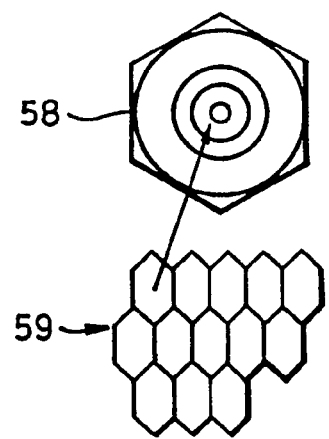
FIG. 12 shows an array of Fresnel lenses for a conventional or annular illumination profile.
Figure 13:
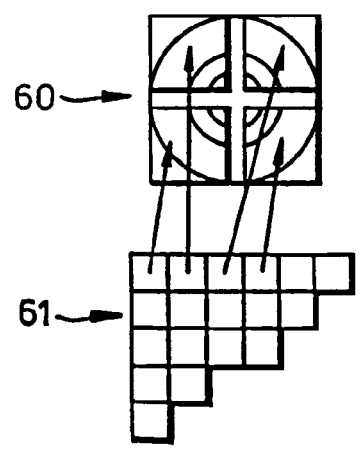
FIG. 13 illustrates an array of Fresnel lens segments for quadrupole illumination according to a further embodiment of the invention.

Two further ways of generating desired illumination modes are shown in FIGS. 12 and 13. For conventional and annular illumination, a micro-lens array as shown in FIG. 12 can be used. Each element of the hexagonal array 59 comprises a Fresnel lens 58 or refractive lens. For flexible quadrupole illumination, the embodiment shown in FIG. 13 can be used. Each element of the square array 61 of micro lenses comprises a segment or quadrant of a Fresnel lens 60. One way of arranging the four quadrants of the lens 60 is shown in FIG. 13. The four lens quadrants create four illumination poles at the pupil plane. Once again, since light flux is redistributed rather than blocked, there is virtually no light loss, so that a high throughput can be maintained.

Figure 14:
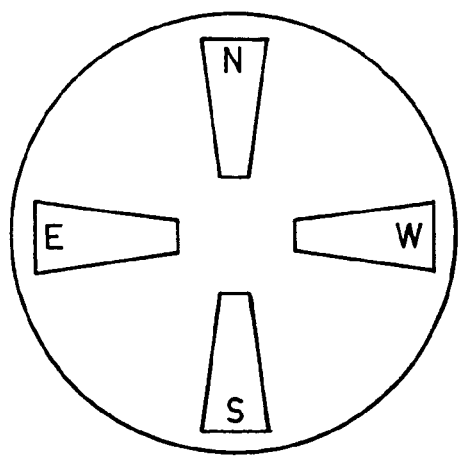
FIGS. 14, 15 and 16 illustrate a further array of lens segments for another embodiment of the invention.
Figure 15:
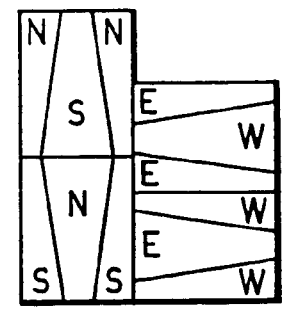
Figure 16:
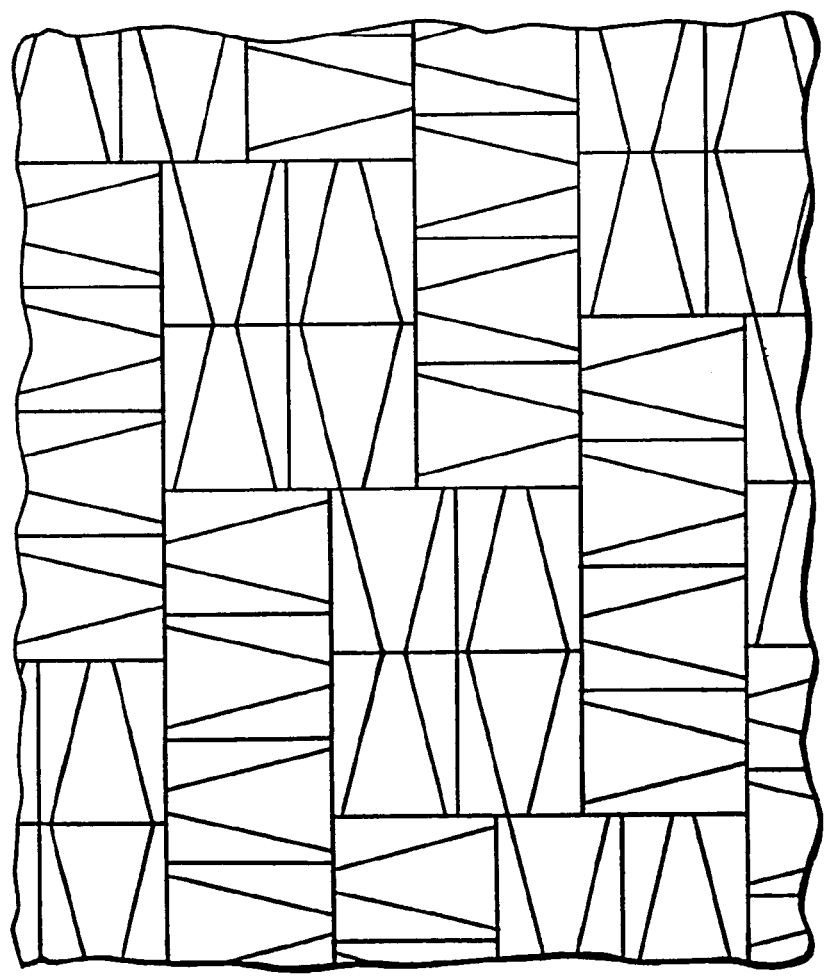

A further currently preferred embodiment of the multipole illumination mode generating element is illustrated with reference to FIGS. 14, 15 and 16. The element is an array of lens segments. This is particularly efficient because the multipole modes are generated without blocking any parts of the beam, so there is no intensity loss and throughput is maintained. FIG. 14 shows where each of four lens segments, labelled N, S, E and W, effectively come from a single lens. The lens segments and half lens segments can be tessellated to form rectangles, as shown in FIG. 15. A complete surface can be covered by lens segments, which are preferably formed into rectangles and tiled in a staggered pattern as shown in FIG. 16.

In practice the lens array can be formed on the surface of a quartz substrate. The lens segments are formed of grooves etched in the surface to provide segments of a Fresnel lens. The depth and width of the grooves is typically of the order of micrometers, each lens segment being of the order of millimetres in size and the array dimensions being centimetres.

Fresnel lenses are merely used as an example. Other types of lenses or diffractive optical elements may be used. The same or better performance can be achieved using conventional refractive lenses or lens segments in the array. However, Fresnel lenses may be preferred from a manufacturing point of view.

Figure 17:
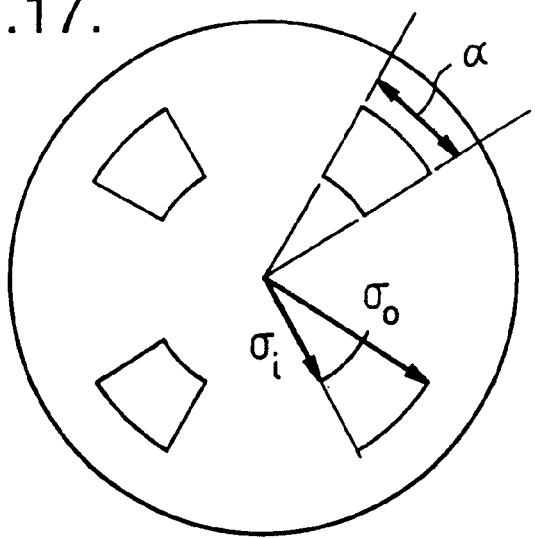
FIG. 17 illustrates an example of a quadrupole illumination modes intensity distribution.

The lens segment shape determines the pole shape. FIG. 17 shows an example of the pole pattern at the lens pupil. In this case, each pole is a segment of an annulus. The angle $\alpha$ of each pole is determined by the lens segment angle. The radii $\sigma_i$ and $\sigma_o$ are adjustable by the axicon/zoom module. A preferred value of $\alpha$ is 30°. Different $\alpha$ values and pole patterns, such as dipole, can be achieved by providing several different, interchangeable, lens arrays or diffractive optical elements. An automatic changer can be used to swap between such different multipole mode generating elements in the illumination system.

The optical elements discussed above can be positioned at the rod entrance, for example as shown in FIGS. 10 and 11, but it can be advantageous to place them at some intermediate cross section of the rod. The intermediate positioning gives a more homogenous angular distribution of the incoming light cones when entering the optical refractive or diffractive elements. The Fresnel lens arrays are particularly suited to excimer laser illumination systems and may be placed in the collimated laser beam, for example before the light enters the axicon/zoom module.

Figure 18:
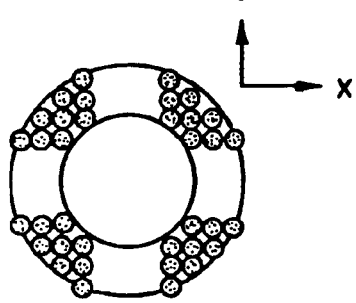
FIG. 18 illustrates an illumination intensity distribution after transmission through a quartz rod.

The above systems for producing quadrupole illumination result in intensity distribution patterns in which there is substantially no light around the x and y axes. The four poles are located at ±45° and ±135° from the positive x axis of the orthogonal coordinate system. The z axis lies along the optical axis of the system and the x and y axes are in the plane perpendicular to the optical axis. In a system including an integrating quartz rod (e.g. FIG. 1), the x-axis is conventionally perpendicular to the long side of the rectangular cross section of the quartz rod, and the y-axis is perpendicular to the short side. After transmission through the quartz rod, the four poles each comprise a number of small dots because of the discrete number of internal reflections along the quartz rod. FIG. 18 illustrates schematically each pole comprising a discrete number of light spots.

Figure 19:
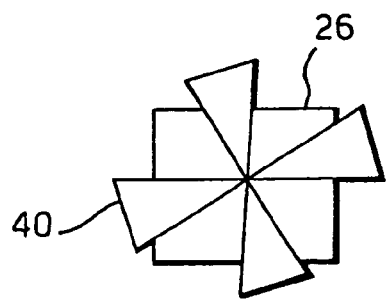
FIG. 19 illustrates a quadrupole mode generating element rotated with respect to the orientation of a quartz rod.
Figure 20:
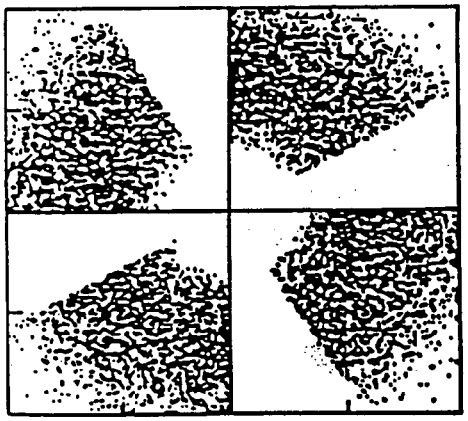
FIG. 20 shows the illumination intensity distribution before transmission through a quartz rod in an illumination system according to a further embodiment of the invention.

According to a further embodiment of the invention, a new illumination mode can be produced which is a mix between quadrupole and annular. This is achieved by orienting the quadrupole mode generating element such that the regions of no light intensity are no longer centered on the x and y axes. For example, the blades of a Maltese cross aperture are rotated about the z-axis by a suitable angle as shown in FIG. 19. FIG. 20 shows an example of the resulting illumination intensity distribution at the pupil plane after the axicon/zoom module and before entry to the quartz rod. The multiple internal reflections in the quartz rod impose a symmetry on the intensity distribution with respect to the x and y axes, resulting in the intensity distribution pattern shown in FIG. 21, after transmission through the quartz rod.

Figure 21:
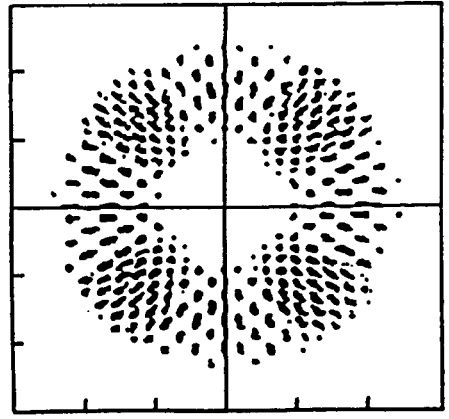
FIG. 21 shows the resulting illumination intensity distribution after transmission through a quartz rod of the incident distribution shown in FIG. 20.

As can be seen in FIG. 21, the result is four regions of high light spot density along the 45° diagonal directions, one in each quadrant. Between these are regions of low light spot density around the x and y axes. The spot densities depend on the positions of the four incident spots, i.e. the orientation of the quadrupole element and the other parameters of the illumination system such as the type of quadrupole element, the axicon and zoom positions.

Figure 22:
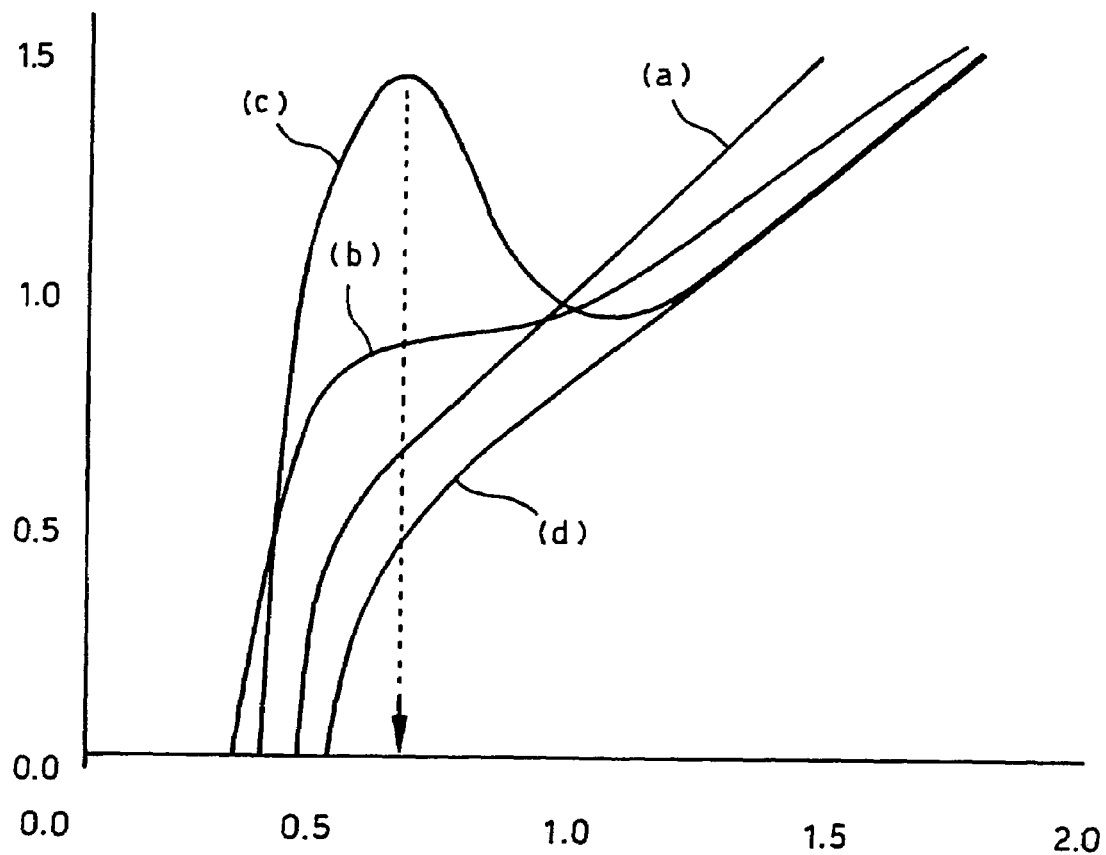
FIG. 22 is a plot of depth of focus against resolution for different illumination modes.

Research shows that for exposing horizontal or vertical features, quadrupole illumination results in larger depths of focus than annular illumination. This is particularly true for dense periodic features. However, for equivalent features oriented around 45° with respect to the x and y axes, the imaging capability with quadrupole illumination will be inferior to annular illumination. This is illustrated in FIG. 22, where the depth of focus (DOF) in micrometres is schematically plotted against resolution ($\lambda$/NA) for (a) conventional circular illumination, (b) annular illumination, (c) quadrupole illumination for horizontal/vertical features and (d) quadrupole illumination for features/lines at 45°. To benefit from the improved depth of focus, the quadrupole parameters must, of course, be selected according to the periodicity of the pattern being imaged.

The intensity distribution of the kind shown in FIG. 21 will be called "soft quadrupole", in contrast to "hard quadrupole", shown in FIG. 17, in which there is no illumination in the vicinity of the x and y axes. Studies indicate that soft quadrupole illumination provides a compromise that improves on annular illumination for vertical and horizontal features, and improves on hard quadrupole illumination for diagonal features. In simulations, the soft quadrupole illumination had, in the annular sections, a relative intensity of 0.5 on the x and y axes and a relative intensity of 1.0 on the diagonals.

Quadrupole illumination can enhance the image definition and depth of focus of finely spaced periodic arrays. Previously it has not been considered very suitable for use with aperiodic and widely spaced (isolated) structures. Where such structures are used in combination with dense periodic arrays (such as edge lines, conductors leading to contact pads, mixed logic and memory circuits, etc.) a compromise has to be found between the use of quadrupole or conventional illumination conditions. Typically this means the quadrupole is "softened" by using soft-edged illumination poles, by enlarging the poles or by adding illumination in the background.

Figure 23A:
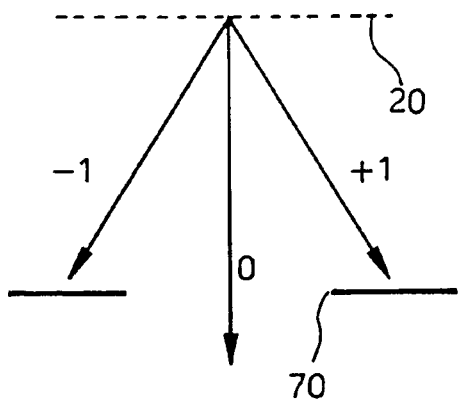
FIGS. 23(a) and (b) show diffracted beams for on- and off-axis illumination modes.
Figure 23B:
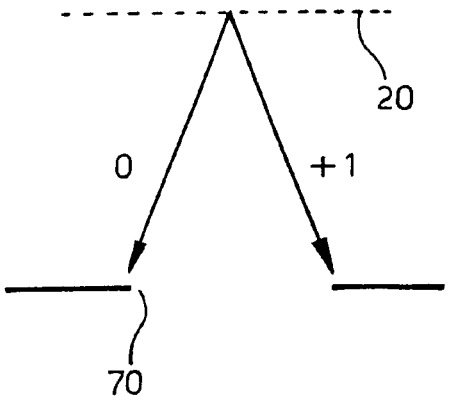

A further embodiment of the present invention is to combine two kinds of illumination in one exposure—conventional illumination for the isolated structures and quadrupole for the dense periodic structures. Since the quadrupole is generally tuned to enhance structures that are at or near the diffraction limit of the lens, conventional illumination cannot resolve these features because the diffraction orders (+1, −1 etc.) fall outside the pupil (70), as shown in FIG. 23(a) for conventional on-axis illumination in contrast with FIG. 23(b) for off-axis illumination, e.g. quadrupole.

However, for isolated features the addition of light intensity to supplement the off-axis illumination will aid the printing of these features. General background illumination will overwhelm the off-axis illumination, so the proportion of off-axis and conventional illumination needs to be controlled. Mixing a well-defined, narrow on-axis beam of light with the off-axis illumination in a fixed ratio can be achieved, for example with a multipole diffractive optical element.

Figure 24:
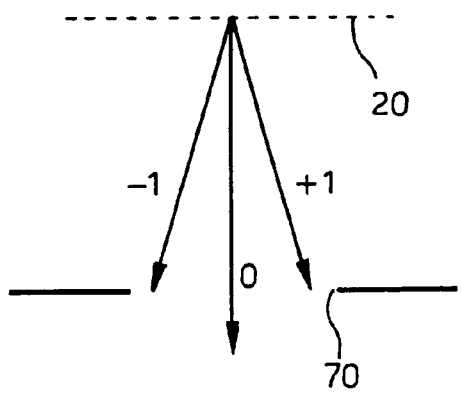
FIG. 24 shows diffracted beams for larger features for on-axis illumination.
Figure 25A:
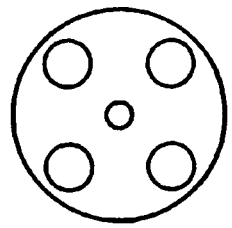
FIGS. 25(a) and 25(b) show mixed illumination mode intensity distributions for relatively small and larger features, respectively.
Figure 25B:
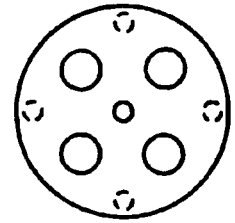

Furthermore, larger features in the image field can be imaged perfectly well with the conventional illumination component of the light whose first order diffraction components do not fall outside the pupil, as shown in FIG. 24. Since the separate illumination sources are not coherent, the images do not interfere with one another, and merely add to each other. Examples of pole patterns for small and large features are illustrated in FIGS. 25(a) and (b) respectively.

Phase shift masks can be used to enhance isolated features. To use these masks the illumination is set to low sigma (highly coherent, close to normal incidence). According to another embodiment of the invention, the combination of quadrupole illumination (which does not enhance isolated features) for enhancing dense arrays and an intense low-sigma central pole for enhancement of isolated features, in combination with a phase shift mask, may yield an overall improvement of depth of focus for all features.

The apparatus of this invention is particularly flexible and has minimal loss of light. The embodiments of the invention described above are suitable for use in lithographic systems operating with ultraviolet illumination, for example using mercury arc lamps or excimer lasers as sources. Typically, mercury arc lamps are used to produce "i-line" radiation with a wavelength of 365 nm, and excimer lasers are used to produce deep ultraviolet radiation at wavelengths of 248 nm, 193 nm and 157 nm.

Although in the illustrated examples the illumination radiation passes through the axicon before the zoom lens, the sequence of these elements can be changed. This is a design choice and can depend on the radiation source that is used.

Figure 26:
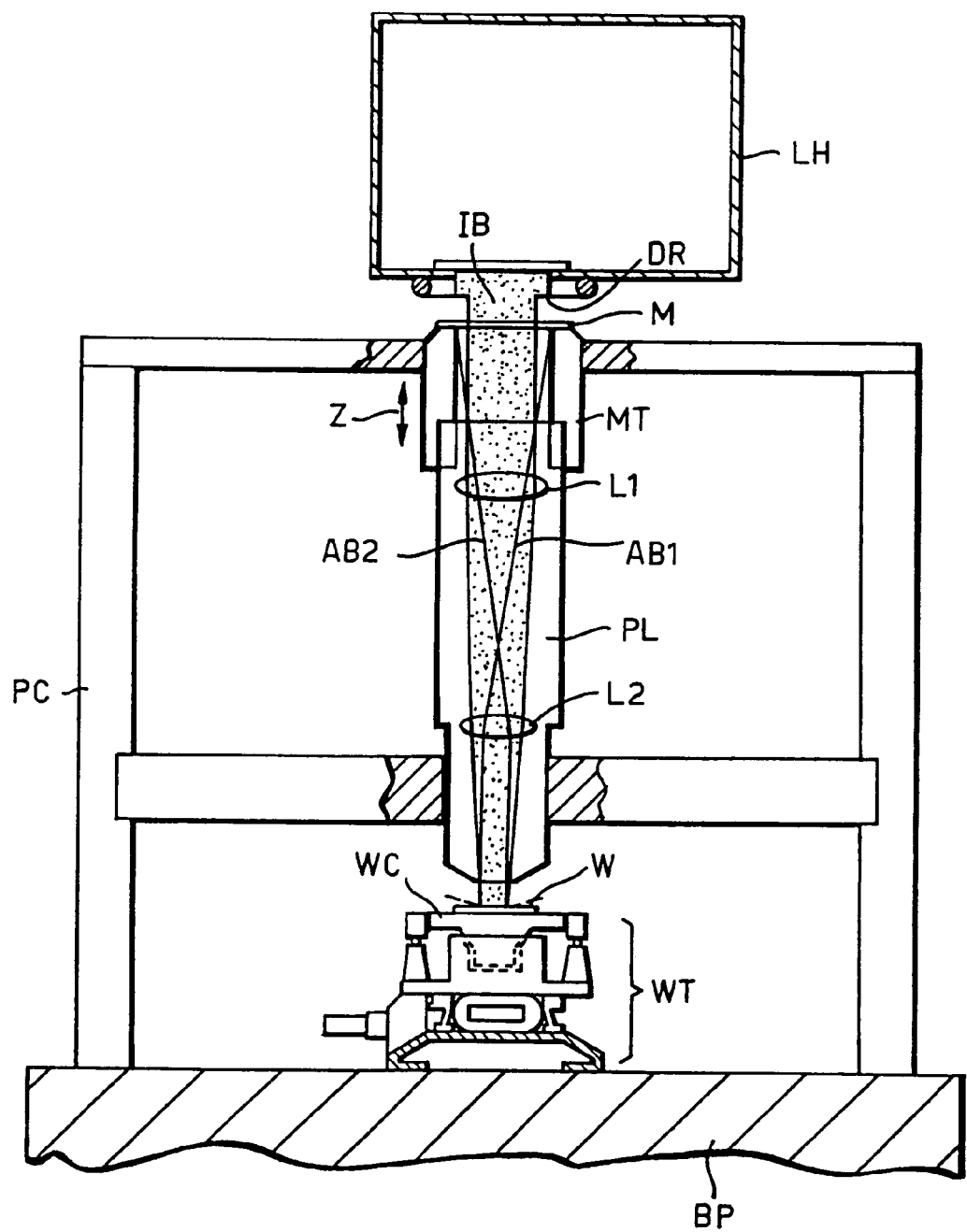
FIG. 26 shows an apparatus for imaging a mask on a substrate, in which apparatus the invention can be embodied.

With reference to FIG. 26, a lithographic apparatus will now be described in which an illumination system as described above can be used to embody the invention, for repetitive imaging of a mask M (for example a reticle) on a substrate W (for example a resist-coated wafer). The particular apparatus shown here is transmissive; however, it may also be reflective or catadioptric, for example.

The apparatus comprises an illumination housing LH containing a radiation source and an illumination system according to the invention for supplying an illumination beam IB. This beam passes through a diaphragm DR and is subsequently incident on the mask M which is arranged on a mask table MT, which is adjustable in position. The mask table MT forms part of a projection column PC incorporating also a projection lens system PL which comprises a plurality of lens elements, only two of which, $L_1$ and $L_2$, are shown in FIG. 26. The projection lens system image mask M onto the substrate W which is provided with a photoresist layer (not shown). The substrate is provided on a substrate support WC which forms part of a substrate table WT on, for example, air bearings. The projection lens system has, for example a magnification M=⅕, a numerical aperture NA>0.48 and a diffraction-limited image field with a diameter of, for example 22 mm. The substrate table WT is supported, for example by a granite base plate BP which closes the projection column PC at its lower side.

The substrate can be displaced in the x, y and z directions and rotated, for example about the z axis with the aid of the substrate table. These adjustments are controlled by various servosystems such as a focus servosystem, for example an x, y, $\phi_z$ interferometer system cooperating with the substrate support, and an alignment system with which mask marks can be aligned with respect to substrate marks. These servosystems are not shown in FIG. 26. Only the alignment beams (with their chief rays $AB_1$, $AB_2$) of the alignment system are shown.

The mask must be imaged a number of times, in accordance with the number of ICs to be formed on the substrate, each time on a different target area of the substrate.

The depicted apparatus can be used in two different modes:

In step mode, the mask stage MT is kept essentially stationary, and an entire mask image is projected in one go (i.e. a single "flash") onto a target area. The substrate stage WT is then shifted in the x and/or y directions so that a different target area can be irradiated by the beam IB.

In scan mode, essentially the same scenario applies, except that a given target area is not exposed in a single "flash". Instead, the mask stage MT is movable in a given direction (the so-called "scan direction", e.g. the x direction) with a speed v, so that the projection beam IB is caused to scan over a mask image; concurrently, the substrate stage WT is simultaneously moved in the same or opposite direction at a speed V=Mv, in which M is the magnification of the lens PL (e.g. M=⅕). In this manner, a relatively large target area can be exposed, without having to compromise on resolution.

These processes are repeated until all areas of the substrate have been illuminated.

Whilst we have described above specific embodiments of the invention it will be appreciated that the invention may be practised otherwise than described.

We claim:

1. A diffractive optical element comprising a plurality of partial optical elements arranged to change a cross-sectional intensity distribution of an incident illumination beam into an output illumination beam having a predetermined cross-sectional intensity distribution, wherein said plurality of partial optical elements comprises at least a first partial optical element that produces a first sub-beam from said incident illumination beam and a second partial optical element that produces a second sub-beam from said incident illumination beam, and wherein said first and second sub-beams contribute to forming said output illumination beam having said predetermined cross-sectional intensity distribution.

2. A diffractive optical element according to claim 1, wherein said diffractive optical element comprises a plurality of groups of said partial optical elements.

3. A diffractive optical element according to claim 2, wherein said partial optical elements of each of said groups of partial optical elements correspond to segments of at least a refractive lens or a diffractive lens.

4. A diffractive optical element according to claim 1, wherein said plurality of partial optical elements are arranged in accordance with a mask pattern to be illuminated by said output illumination beam to provide an increased process latitude when used in a lithographic projection system compared to conventional or annular illumination of said mask pattern.

5. A diffractive optical element according to claim 1, wherein said partial optical elements are constructed and arranged to provide said output illumination beam with a predetermined angular intensity distribution.

6. An illumination system for illuminating a mask provided to a lithographic apparatus, comprising:

an illumination source;

an illumination beam shaping system arranged to receive an illumination beam from said illumination source; and an optical integrator arranged to receive a selectively shaped illumination beam output from said illumination beam shaping system, wherein said illumination beam shaping system comprises a diffractive optical element comprising a plurality of partial optical elements arranged to change a cross-sectional intensity distribution of an incident illumination beam into an output illumination beam having a predetermined cross-sectional intensity distribution, wherein said plurality of partial optical elements comprises at least a first partial optical element that produces a first sub-beam from said incident illumination beam and a second partial optical element that produces a second sub-beam from said incident illumination beam, said first sub-beam being different from said second sub-beam, and wherein said first and second sub-beams contribute to forming said output illumination beam having said predetermined cross-sectional intensity distribution.

7. An illumination system according to claim 6, wherein said optical integrator is a light pipe.

8. An illumination system according to claim 7, wherein said plurality of partial optical elements are partial Fresnel lens elements etched into an end of said light pipe.

9. An illumination system according to claim 7, wherein said light pipe has a rectangular cross-sectional shape.

10. An illumination system according to claim 6, wherein said optical integrator is a fly's eye element.

11. An illumination system according to claim 6, wherein said illumination beam shaping system further comprises an axicon module comprising a pair of axicons having a variable separation therebetween, said beam shaping system providing beam shaping that can be adjusted by varying at least said variable spacing between said pair of axicons.

12. An illumination system according to claim 6, wherein said partial optical elements are constructed and arranged to provide said output illumination beam with a predetermined angular intensity distribution.

13. An illumination system according to claim 6, wherein said diffraction optical element is disposed between said illumination source and said optical integrator.

14. An illumination system according to claim 11, wherein said illumination beam shaping system further comprises a zoom lens system.

15. An illumination system according to claim 11, wherein an illumination beam from said illumination system has a multipole cross-sectional intensity pattern.

16. An illumination system according to claim 15, wherein said multipole cross-sectional intensity pattern is a quadrupole pattern.

17. A lithographic apparatus, comprising:
an illumination system constructed and arranged to provide an output illumination beam having a predetermined cross-sectional intensity distribution;
a first object table having a mask holder constructed and arranged to hold a mask to be illuminated by said output illumination beam from said illumination system;
a projection system arranged to project an image of an illuminated portion of said mask onto a target portion of a substrate; and
a second object table having a substrate holder arranged to hold said target portion of said substrate to be exposed by said image of said illuminated portion of said mask,
wherein said illumination system comprises a diffractive optical element comprising a plurality of partial optical elements arranged to change a cross-sectional intensity distribution of an incident illumination beam into an output illumination beam having a predetermined cross-sectional intensity distribution, wherein said plurality of partial optical elements comprises at least a first partial optical element that produces a first sub-beam from said incident illumination beam and a second partial optical element that produces a second sub-beam from said incident illumination beam, said first sub-beam being different from said second sub-beam, and wherein said first and second sub-beams contribute to forming said output illumination beam having said predetermined cross-sectional intensity distribution.

18. A lithographic apparatus according to claim 17, wherein said partial optical elements are constructed and arranged to provide said output illumination beam with a predetermined angular intensity distribution.

19. A lithographic apparatus according to claim 17, wherein said illumination system further comprises an optical integrator and imaging optics arranged at an output side of said optical integrator.

20. A lithographic apparatus according to claim 17, wherein said illumination system includes a light pipe.

21. A lithographic apparatus according to claim 20, wherein said plurality of partial optical elements are partial Fresnel lens elements etched into an end of said light pipe.

22. A lithographic apparatus according to claim 20, wherein said light pipe has a rectangular cross-sectional shape.

23. A lithographic apparatus according to claim 17, wherein said illumination system includes a fly's eye element.

24. A lithographic apparatus according to claim 17, wherein said illumination system includes an optical integrator and wherein said diffraction optical element is disposed between said illumination source and said optical integrator.

25. A lithographic apparatus according to claim 17, wherein said illumination beam shaping system further comprises a zoom lens system.

26. A diffractive optical element comprising a plurality of partial optical elements arranged to change an illumination mode of an incident illumination beam into an output illumination beam having a predetermined illumination mode, wherein said plurality of partial optical elements comprises a first group of partial optical elements that produces a first sub-beam from said incident illumination beam and a second group of partial optical elements that produces a second sub-beam from said incident illumination beam, and wherein said first and second sub-beams contribute to forming said output illumination beam having said predetermined illumination mode.

27. A diffractive optical element according to claim 26, wherein said predetermined mode is a quadrupole illumination mode.

* * * * *